(12) United States Patent
Xie et al.

(10) Patent No.: US 11,887,890 B2
(45) Date of Patent: Jan. 30, 2024

(54) PARTIAL SELF-ALIGNED CONTACT FOR MOL

(71) Applicant: International Business Machines Corporation, Armonk, NY (US)

(72) Inventors: Ruilong Xie, Niskayuna, NY (US); Veeraraghavan Basker, Schenectady, NY (US); Alexander Reznicek, Troy, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 17/553,950

(22) Filed: Dec. 17, 2021

(65) Prior Publication Data

US 2022/0108923 A1 Apr. 7, 2022

Related U.S. Application Data

(62) Division of application No. 16/669,231, filed on Oct. 30, 2019, now Pat. No. 11,239,115.

(51) Int. Cl.
  *H01L 21/28* (2006.01)
  *H01L 29/423* (2006.01)
  (Continued)

(52) U.S. Cl.
  CPC .. *H01L 21/76897* (2013.01); *H01L 21/28141* (2013.01); *H01L 21/31111* (2013.01); *H01L 21/76834* (2013.01); *H01L 21/76895* (2013.01); *H01L 29/66545* (2013.01); *H01L 29/66583* (2013.01); *H01L 29/785* (2013.01)

(58) Field of Classification Search
  CPC ......... H01L 29/66545; H01L 21/76897; H01L 29/4966; H01L 29/785; H01L 29/41791
  See application file for complete search history.

(56) References Cited

U.S. PATENT DOCUMENTS 6,638,843 B1 10/2003 Hineman
6,869,850 B1 3/2005 Blosse et al.
(Continued)

OTHER PUBLICATIONS

List of IBM Patents or Applications Treated as Related, Dec. 17, 2021 (2 pages).

*Primary Examiner* — Anthony Ho
*Assistant Examiner* — David J Goodwin
(74) *Attorney, Agent, or Firm* — Stosch Sabo

(57) ABSTRACT

Partial self-aligned contact structures are provided. In one aspect, a method of forming a semiconductor device includes: patterning fins in a substrate; forming a gate(s) over the fins, separated from source/drains by first spacers, wherein a lower portion of the gate(s) includes a workfunction-setting metal, and an upper portion of the gate(s) includes a core metal between a metal liner; recessing the metal liner to form divots in the upper portion of the gate(s) in between the first spacers and the core metal; forming second spacers in the divots such that the first spacers and the second spacers surround the core metal in the upper portion of the gate(s); forming lower source/drain contacts in between the first spacers over the source/drains; recessing the lower source/drain contacts to form gaps over the lower source/drain contacts; and forming source/drain caps in the gaps. A semiconductor device is also provided.

20 Claims, 17 Drawing Sheets

(51) Int. Cl.
*H01L 29/66* (2006.01)
*H01L 29/417* (2006.01)
*H01L 21/768* (2006.01)
*H01L 29/78* (2006.01)
*H01L 21/311* (2006.01)

(56) References Cited

U.S. PATENT DOCUMENTS

| | | |
|---|---|---|
| 7,015,552 B2 | 3/2006 | Ye et al. |
| 8,421,077 B2 | 4/2013 | Jain et al. |
| 8,927,408 B2 | 1/2015 | Li et al. |
| 9,059,134 B2 | 6/2015 | Ramachandran et al. |
| 9,368,590 B2 | 6/2016 | Fan et al. |
| 9,508,818 B1 | 11/2016 | Basker et al. |
| 9,691,897 B2 | 6/2017 | Xie et al. |
| 9,865,697 B1 | 1/2018 | Hsueh et al. |
| 9,870,952 B1* | 1/2018 | Cheng .............. H01L 21/823885 |
| 9,929,048 B1 | 3/2018 | Xie et al. |
| 10,192,783 B2 | 1/2019 | Pethe et al. |
| 10,276,391 B1* | 4/2019 | Zang ................. H01L 21/28247 |
| 2014/0077305 A1 | 3/2014 | Pethe et al. |
| 2014/0217482 A1* | 8/2014 | Xie ..................... H01L 29/6653 257/288 |
| 2015/0206754 A1* | 7/2015 | Horak ................ H01L 29/6653 257/288 |
| 2018/0053694 A1 | 2/2018 | Cheng et al. |
| 2018/0166548 A1 | 6/2018 | Huang et al. |
| 2018/0269320 A1* | 9/2018 | Chi ................... H01L 29/66795 |
| 2018/0350932 A1* | 12/2018 | Liu ................... H01L 21/32133 |
| 2021/0028290 A1 | 1/2021 | Hsiao et al. |
| 2021/0119010 A1 | 4/2021 | Yeong et al. |
| 2021/0134671 A1 | 5/2021 | Xie et al. |

* cited by examiner

ID: 11,887,890 B2

PARTIAL SELF-ALIGNED CONTACT FOR MOL

FIELD OF THE INVENTION

The present invention relates to contact structures, and more particularly, to middle-of-line (MOL) partial self-aligned contact structures and techniques for formation thereof.

BACKGROUND OF THE INVENTION

A self-aligned contact (SAC) process for semiconductor device fabrication involves first placing a dielectric cap over device structures such as the gates. The cap serves as an isolation layer. In that case, source and drain contacts can be formed that also land directly on the gates without shorting concerns since the gate is isolated by the cap.

However, employing a traditional SAC process with scaling beyond 7 nm technologies presents some notable drawbacks. For example, the dielectric cap increases the gate height. An increased gate height can undesirably lead to gate bending issues, especially with scaled devices.

Other approaches involve non-SAC middle-of-line (MOL) designs since non-SAC MOL increases efficiency and output as there is no need for complex modules involving SAC cap formation and self-aligned contact etch. Thus, non-SAC MOL processes can lower production costs.

However, there are two fundamental challenges associated with this non-SAC structure. First, as the gate pitch is further scaled, gate-to-source/drain shorts become an increasing concern. Second, conventional non-SAC MOL structures are not compatible with gate contact over active area design layouts.

Accordingly, there is a need for improved contact structures that are compatible with MOL scaling.

SUMMARY OF THE INVENTION

The present invention provides middle-of-line (MOL) partial self-aligned contact structures and techniques for formation thereof. In one aspect of the invention, a method of forming a semiconductor device is provided. The method includes: patterning fins in a substrate; forming source and drains in the fins; forming at least one gate over the fins, separated from the source and drains by first spacers, wherein a lower portion of the at least one gate includes a workfunction-setting metal, and wherein an upper portion of the at least one gate includes an inner core metal between an outer metal liner; recessing the outer metal liner to form divots in the upper portion of the at least one gate in between the first spacers and the inner core metal; forming second spacers in the divots such that the first spacers and the second spacers surround the inner core metal in the upper portion of the at least one gate; forming lower source and drain contacts in between the first spacers over the source and drains; recessing the lower source and drain contacts to form gaps over the lower source and drain contacts; and forming source and drain caps in the gaps.

In another aspect of the invention, another method of forming a semiconductor device is provided. The method includes: patterning fins in a substrate; forming source and drains in the fins; forming at least one gate over the fins, separated from the source and drains by first spacers, wherein a lower portion of the at least one gate includes a workfunction-setting metal, and wherein an upper portion of the at least one gate includes an inner core metal between an outer metal liner; recessing the outer metal liner to form divots in the upper portion of the at least one gate in between the first spacers and the inner core metal; forming second spacers in the divots such that the first spacers and the second spacers surround the inner core metal in the upper portion of the at least one gate; forming lower source and drain contacts in between the first spacers over the source and drains; recessing the lower source and drain contacts to form gaps over the lower source and drain contacts; forming source and drain caps in the gaps; depositing an MOL dielectric over the at least one gate and the source and drains; forming an upper source and drain contact in the MOL dielectric over a select one of the lower source and drain contacts; and forming a gate contact in the MOL dielectric over the at least one gate.

In yet another aspect of the invention, a semiconductor device is provided. The semiconductor device includes: fins patterned in a substrate; source and drains formed in the fins; at least one gate disposed over the fins, separated from the source and drains by first spacers, wherein a lower portion of the at least one gate includes a workfunction-setting metal, and an upper portion of the at least one gate includes an inner core metal between an outer metal liner, and wherein the outer metal liner is recessed in between the first spacers and the inner core metal; second spacers disposed over the recessed outer metal liner such that the first spacers and the second spacers surround the inner core metal in the upper portion of the at least one gate; an MOL dielectric disposed over the at least one gate and the source and drains; and a gate contact in the MOL dielectric over the at least one gate, wherein the gate contact lands on the inner core metal, and on the first spacers and the second spacers that surround the inner core metal of the at least one gate.

A more complete understanding of the present invention, as well as further features and advantages of the present invention, will be obtained by reference to the following detailed description and drawings.

DETAILED DESCRIPTION OF PREFERRED EMBODIMENTS

Provided herein are middle-of-line (MOL) partial self-aligned contact structures and techniques for formation thereof. As will be described in detail below, the present techniques provide the benefits of a partial self-aligned upper source and drain contact and a fully self-aligned gate contact. Namely, as will become apparent from the description that follows, an upper portion of the gates are surrounded by the combination of a first spacer and a second spacer, and a lower source and drain contact is covered by a cap. No recessing of the gates is needed to form the gate contact, hence the gate contact is fully self-aligned. Removal of the source and drain cap is needed to form the upper source and drain contact over the lower source and drain contact. Hence the upper source and drain contact is partially self-aligned. Advantageously, the upper source and drain contact-to-gate short overlay margin is vastly improved by the first spacer and second spacer that surround the upper portions of the gates.

Figure 1:
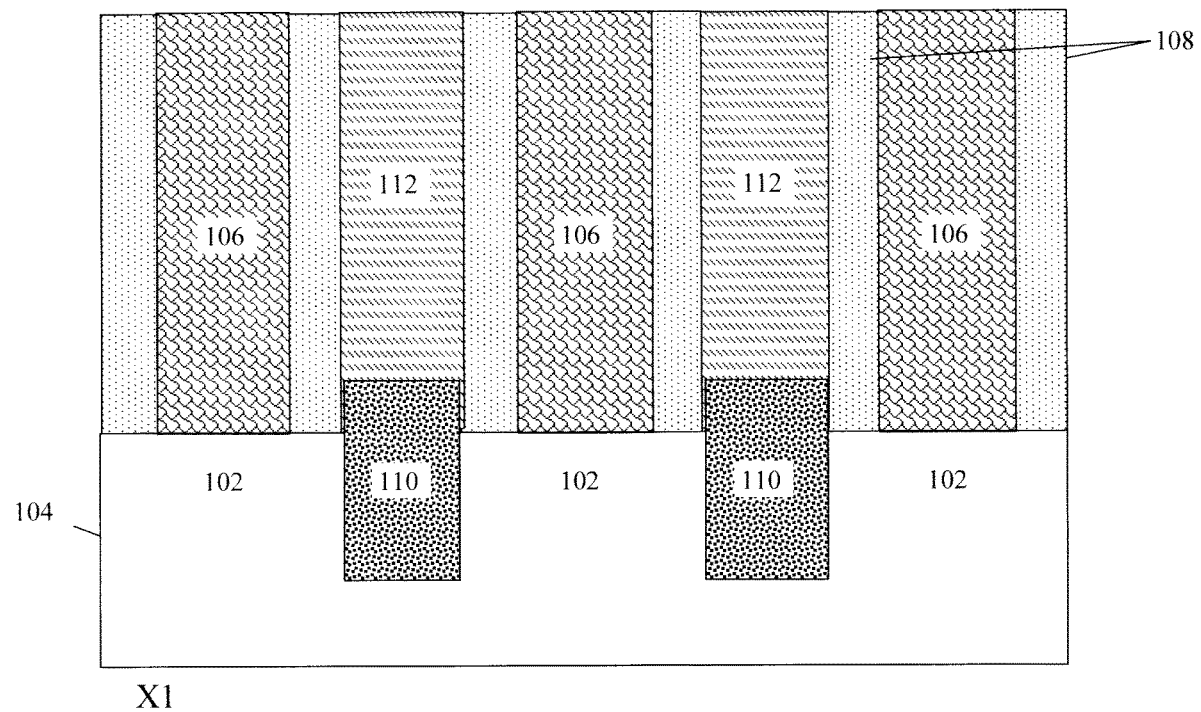
FIG. 1 is a cross-sectional diagram illustrating fins having been patterned in a substrate, sacrificial gates having been formed over the fins, first spacers having been formed on opposite sides of the sacrificial gates, source and drains having been formed on opposite sides of the sacrificial gates offset from the sacrificial gates by the first spacers, and the sacrificial gates and gate spacers having been buried in an interlayer dielectric (ILD) according to an embodiment of the present invention.

An exemplary methodology for forming a semiconductor device in accordance with the present techniques is now described by way of reference to FIGS. 1-17. As shown in FIG. 1, the process begins with the patterning of fins 102 in a substrate 104. According to an exemplary embodiment, substrate 104 is a bulk semiconductor wafer, such as a bulk silicon (Si), bulk germanium (Ge), bulk silicon germanium (SiGe) and/or bulk III-V semiconductor wafer. Alternatively, substrate 104 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Standard lithography and etching techniques are used to pattern the fins 102 in substrate 104. With standard lithography and etching processes, a lithographic stack (not shown), e.g., photoresist/organic planarizing layer (OPL)/anti-reflective coating (ARC), is used to pattern a hardmask (not shown). The pattern from the hardmask is then transferred to the underlying substrate. The hardmask is then removed. A directional (anisotropic) etching process such as reactive ion etching (RIE) can be employed for the fin etch.

Figure 2:
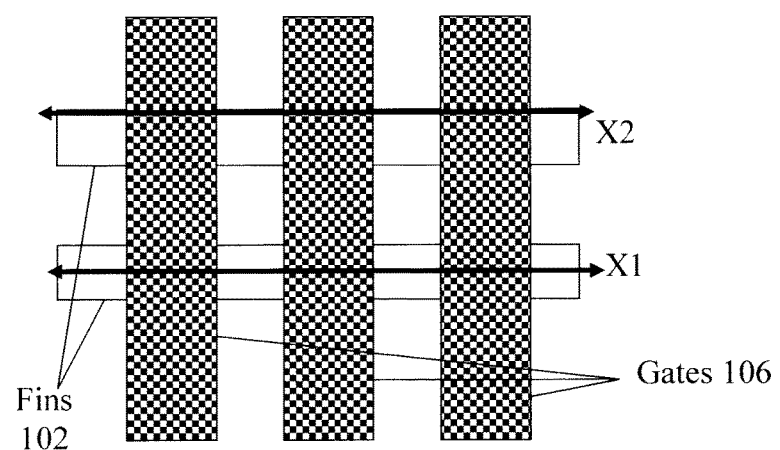
FIG. 2 is a top-down diagram illustrating an orientation of the various cross-sectional views of the device structure relative to the fins and gates according to an embodiment of the present invention.

In general, gates will be formed over fins 102, and source and drains will be formed on opposite sides of the gates. The source and drains will be offset from the gates by gate spacers. For instance, referring briefly to FIG. 2 (a top-down view), the gates are formed over the fins 102. The gates are formed as lines that extend perpendicular to fins 102. As will be described in detail below, the present techniques can be implemented using a gate-last process. In that case, the gates depicted in FIG. 2 generically represent either sacrificial gates 106 (see FIG. 1) formed early on in the gate-last process, or the replacement metal gates (RMGs) swapped for the sacrificial gates 106 later in the gate-last process. FIG. 2 also illustrates the orientation of the various cross-sectional views of the device structure that will be presented in the following figures. For example, cross-sectional views X1 will depict a cut along a center of one of the fins 102 perpendicular to the gates 106, while cross-sectional views X2 will depict a cut along a side of one of the fins 102 perpendicular to the gates 106.

Referring back to FIG. 1 (a cross-sectional view X1), according to an exemplary embodiment, the present techniques are implemented in conjunction with a gate-last process. With a gate-last process, sacrificial gates are formed over the channel region of the device early on in the process. The sacrificial gates are then used to place the source and drains on opposite sides of the channel region. The sacrificial gates are then removed and replaced with a final, i.e., replacement, gate stack of the device. When the replacement gate stack is a metal gate, it is also referred to herein as a replacement metal gate or RMG. A notable advantage of the gate-last process is that it prevents the final gate components from being exposed to potentially damaging conditions, such as elevated temperatures, experienced during fabrication. Of particular concern are high-κ gate dielectrics which can be damaged by exposure to elevated temperatures such as those experienced during source/drain formation.

To begin the gate-last process, sacrificial gates 106 are formed on the fins 102. According to an exemplary embodiment, sacrificial gates are formed by first depositing a suitable sacrificial material onto substrate 104 over fins 102, and then patterning the sacrificial material into the individual sacrificial gates 106 shown in FIG. 1. The sacrificial material can be deposited using a process such as chemical vapor deposition (CVD), atomic layer deposition (ALD) or physical vapor deposition (PVD). Suitable sacrificial materials include, but are not limited to, a thin (e.g., from about 0.3 nanometers (nm) to about 5 nm, and ranges therebetween) layer of silicon dioxide ($SiO_2$)) followed by polysilicon (Si) and/or amorphous Si. Standard lithography and etching techniques (see above) can be employed to pattern the sacrificial gates 106 using a directional (anisotropic) etching process such as RIE.

Gate spacers 108 are then formed on opposite sides of the sacrificial gates 106. As will be described in detail below, gate spacers serve to offset the source and drains from the sacrificial gates 106. According to an exemplary embodiment, gate spacers 108 are formed by first depositing a suitable spacer material over the sacrificial gates 106 and then using anisotropic etching techniques to etch the spacer material as shown in FIG. 1 such that the final spacer 108 is present along the opposite sidewalls of the sacrificial gates 106. The spacer material can be deposited using a process such as CVD, ALD or PVD. A directional (anisotropic) etching process such as RIE can be employed for the spacer etch. Suitable spacer materials include, but are not limited to, oxide spacer materials such as silicon oxide (SiOx) and/or silicon oxycarbide (SiOC) and/or nitride spacer materials such as silicon nitride (SiN), silicon borocarbonitride (SiBCN) and/or silicon oxycarbonitride (SiOCN).

Source and drains 110 are then formed in the fins on opposite sides of the sacrificial gates 106, offset from the sacrificial gate 106 by the gate spacers 108. According to an exemplary embodiment, source and drains 110 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

The sacrificial gates 106 and gate spacers 108 are then buried in an interlayer dielectric (ILD) 112 that is deposited over source/drains 110, followed by planarization using a process such as chemical-mechanical polishing (CMP). ILD 112 can be deposited using a process such as CVD, ALD or PVD. Suitable ILDs 112 include, but are not limited to, oxide materials such as SiOx and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Figure 3:
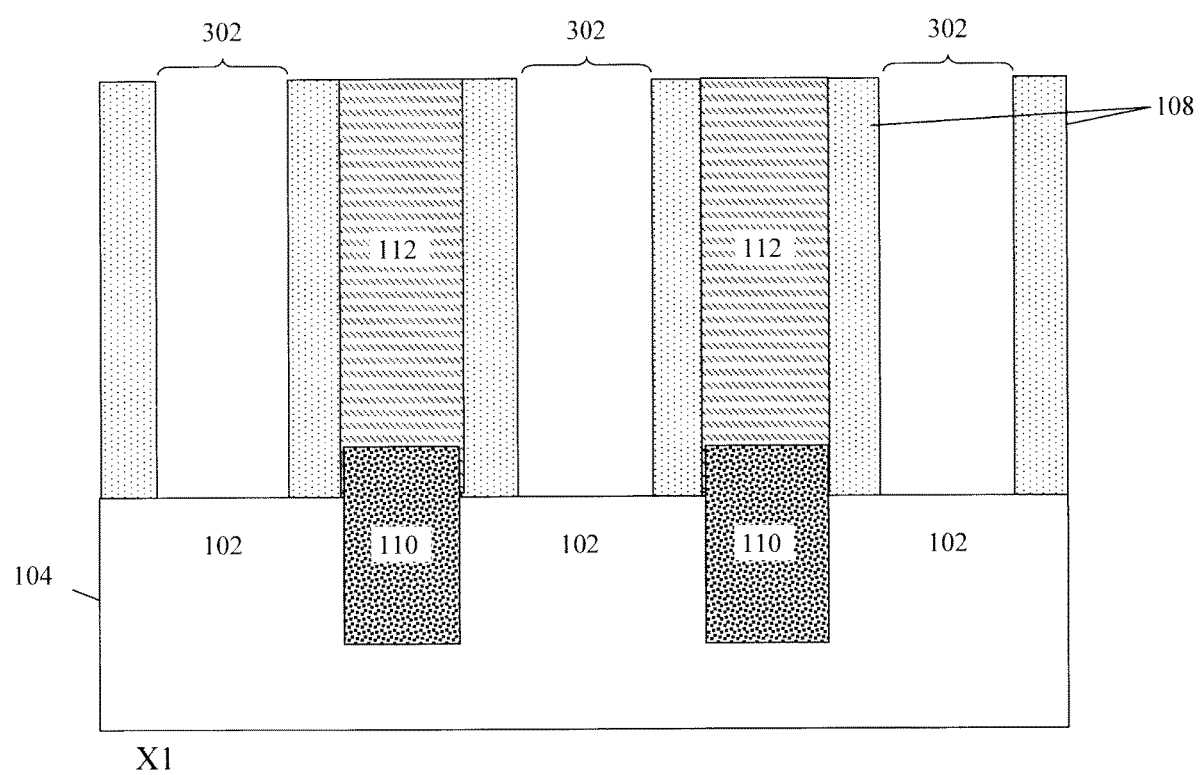
FIG. 3 is a cross-sectional diagram illustrating the sacrificial gates having been selectively removed forming gate trenches in between the first spacers according to an embodiment of the present invention.

The placement of ILD 112 enables the sacrificial gates 106 to then be selectively removed. See FIG. 3. As shown in FIG. 3 (a cross-sectional view X1), removal of the sacrificial gates 106 forms gate trenches 302 in ILD 112 in between the gate spacers 108. According to an exemplary embodiment, sacrificial gates 106 are removed using a (poly-Si and/or amorphous-Si) selective directional (anisotropic) etching process such as RIE or wet process.

Replacement gate stacks are then formed in the gate trenches 302. In the present example, the replacement gate stacks are replacement metal gates or RMGs. Further, this process flow will describe the co-fabrication of at least one n-channel fin field effect transistor (NFET) and at least one p-channel fin field effect transistor (PFET) together on the same substrate 104. However, it is to be understood that the present techniques can be implemented in the fabrication of devices of either polarity (n-type or p-type) solely, or any number of NFET devices in combination with any number of PFET devices, or even a single NFET or PFET device.

Further, in the present example, a gate chamfering process is employed whereby a conformal workfunction-setting metal is deposited, followed by a sacrificial material. Recessing of the sacrificial material then enables chamfering of the conformal workfunction-setting metal, after which the sacrificial material is removed. This chamfering process permits formation of the upper portions of the replacement gates having an outer metal liner and an inner metal core (see below). As will be described in detail below, recessing of the outer metal liner selective to the inner metal core permits the second spacers to be formed alongside the inner metal core. Advantageously, as highlighted above, the second spacers vastly improve the upper source and drain contact-to-gate short overlay margin.

Figure 4:
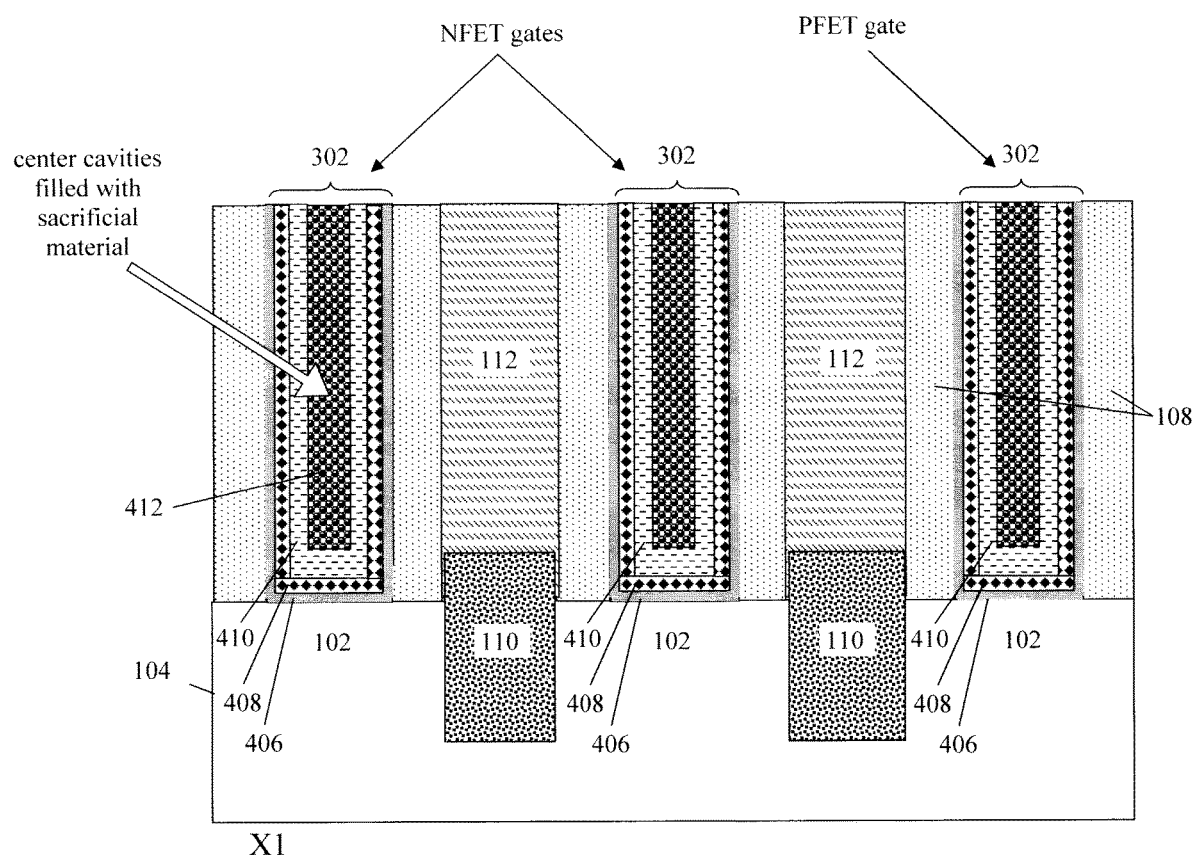
FIG. 4 is a cross-sectional diagram illustrating a conformal gate stack having been formed in the gate trenches having an interfacial oxide on the fins, a gate dielectric lining the gate trenches, and a workfunction-setting metal over the gate dielectric wherein the conformal gate stack provides a cavity at the center of each of the gate trenches, and the cavity having been filled with a sacrificial material according to an embodiment of the present invention.
Figure 5:
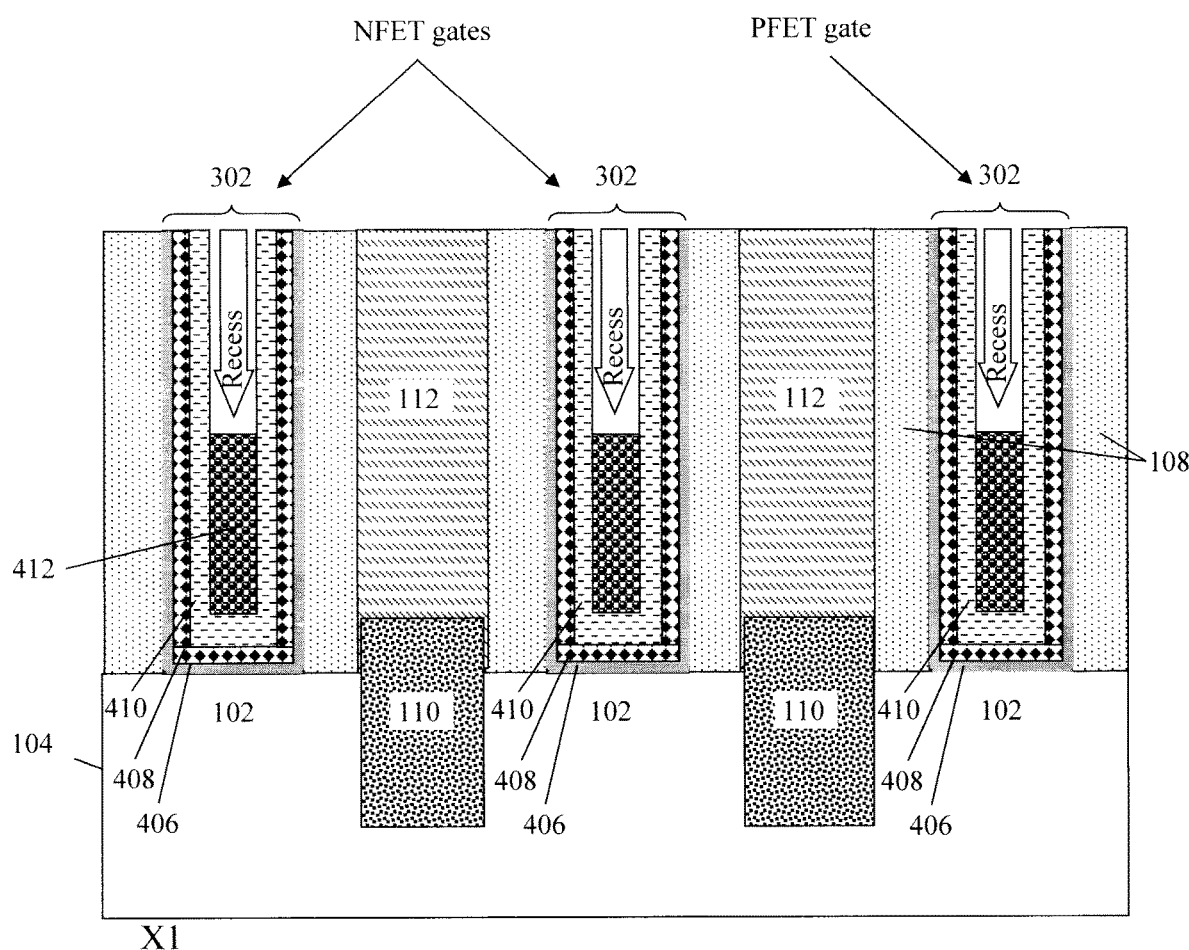
FIG. 5 is a cross-sectional diagram illustrating the sacrificial material having been recessed according to an embodiment of the present invention.

Specifically, referring to FIG. 4 (a cross-sectional view X1), a conformal gate stack is formed in the gate trenches 302. According to an exemplary embodiment, the gate stack includes an interfacial oxide 406 formed on exposed surfaces of fins 102 within gate trenches 302, a conformal gate dielectric 408 deposited into, and lining the bottom and sidewalls of the gate trenches 302 over the interfacial oxide 406, and a conformal workfunction-setting metal 410 deposited into, and lining the bottom and sidewalls of the gate trenches 302 over the gate dielectric 408.

Interfacial oxide 406 (e.g., silicon dioxide ($SiO_2$) which may include other chemical elements in it such as nitrogen, germanium, etc.) can be formed selectively on exposed surfaces of the fins 102 by an oxidation process. According to an exemplary embodiment, interfacial oxide 406 has a thickness of from about 0.3 nm to about 5 nm, and ranges therebetween, e.g., about 1 nm.

According to an exemplary embodiment, gate dielectric 408 is a high-κ dielectric. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$) and/or lanthanum oxide ($La_2O_3$). Gate dielectric 408 can be conformally deposited into, and lining the bottom and sidewalls of the gate trenches 302 over the interfacial oxide 406 using a process such as CVD, ALD or PVD. According to an exemplary embodiment, gate dielectric 408 has a thickness of from about 2 nm to about 10 nm and ranges therebetween.

The particular workfunction-setting metal 410 employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

Workfunction-setting metal 410 can be deposited into the gate trenches 302 onto the gate dielectric 408 using a process such as ALD. According to an exemplary embodiment, workfunction-setting metal 410 has a thickness of from about 1 nm to about 20 nm and ranges therebetween. As provided above, the thickness of workfunction-setting metal 402 can vary depending on whether an n-type or p-type transistor is desired.

According to an exemplary embodiment, workfunction-setting metal 410 includes an n-type workfunction-setting metal(s) and the n-type workfunction-setting metal(s) is later selectively removed from the PFET gate stack(s) (see below). However, this is merely an example, and various other NFET and PFET gate stack configurations are contemplated herein. For instance, by way of example only, an n-type workfunction-setting metal(s) can be employed in the NFET gate stacks, whereas a p-type workfunction-setting metal(s) is employed in PFET gate stacks that differs from the n-type workfunction-setting metal(s) in composition and/or thickness.

Conformally depositing the gate stack (i.e., gate dielectric 408 and workfunction-setting metal 410) provides a cavity at the center of each gate trench 302, which is then filled with a sacrificial material 412. Following deposition, the sacrificial material 412 can be planarized using a process such as CMP or an etch back process. Suitable sacrificial materials 412 include, but are not limited to, poly-Si and/or amorphous Si. Sacrificial material 412 can be deposited using a process such as CVD, ALD or PVD.

Sacrificial material 412 is then recessed. See FIG. 5 (a cross-sectional view X1). As will be described in detail below, recessing of sacrificial material 412 will enable recessing of the upper gate stack (i.e., gate dielectric 408 and workfunction-setting metal 410). According to an exemplary embodiment, sacrificial material 412 is recessed using a (poly-Si and/or amorphous-Si) selective directional (anisotropic) etching process such as RIE.

Figure 6:
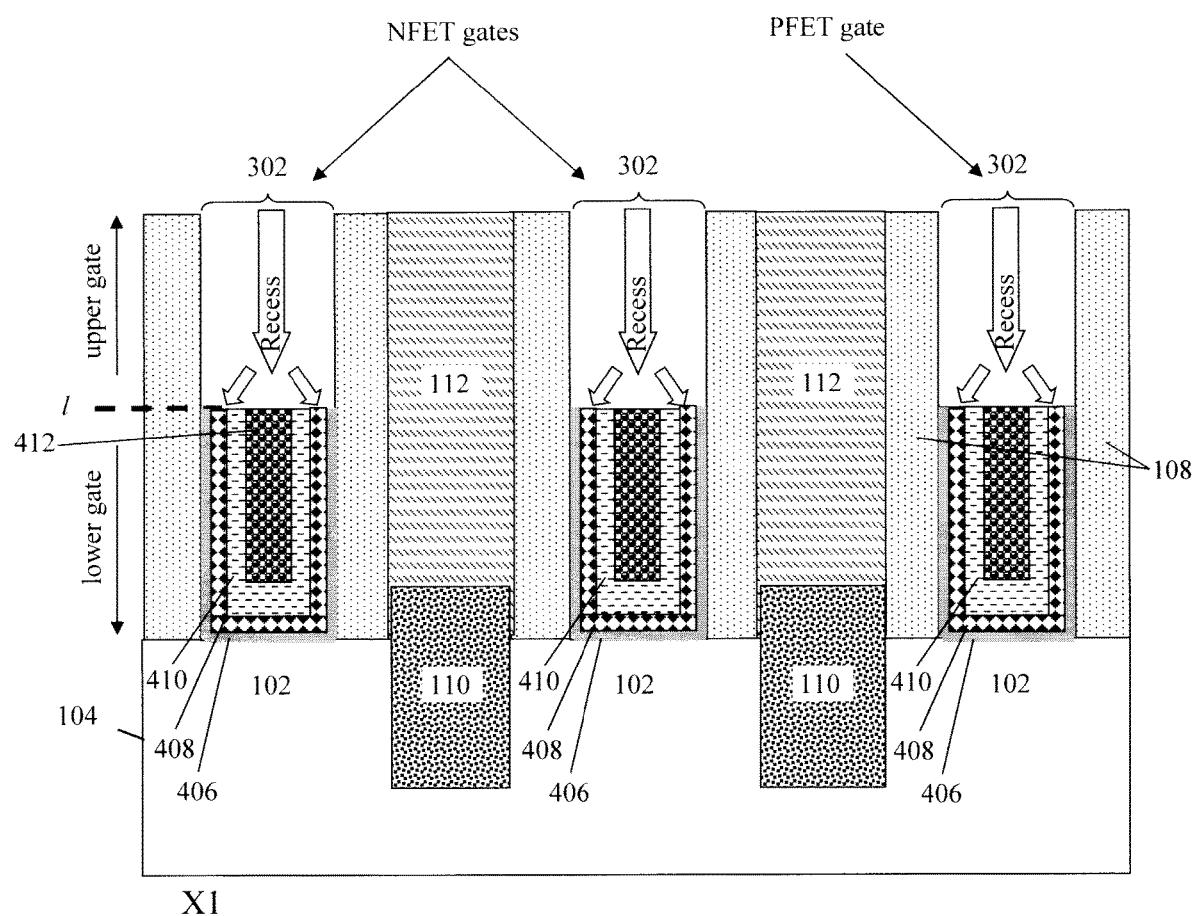
FIG. 6 is a cross-sectional diagram illustrating the conformal gate stack having been recessed according to an embodiment of the present invention.
Figure 7:
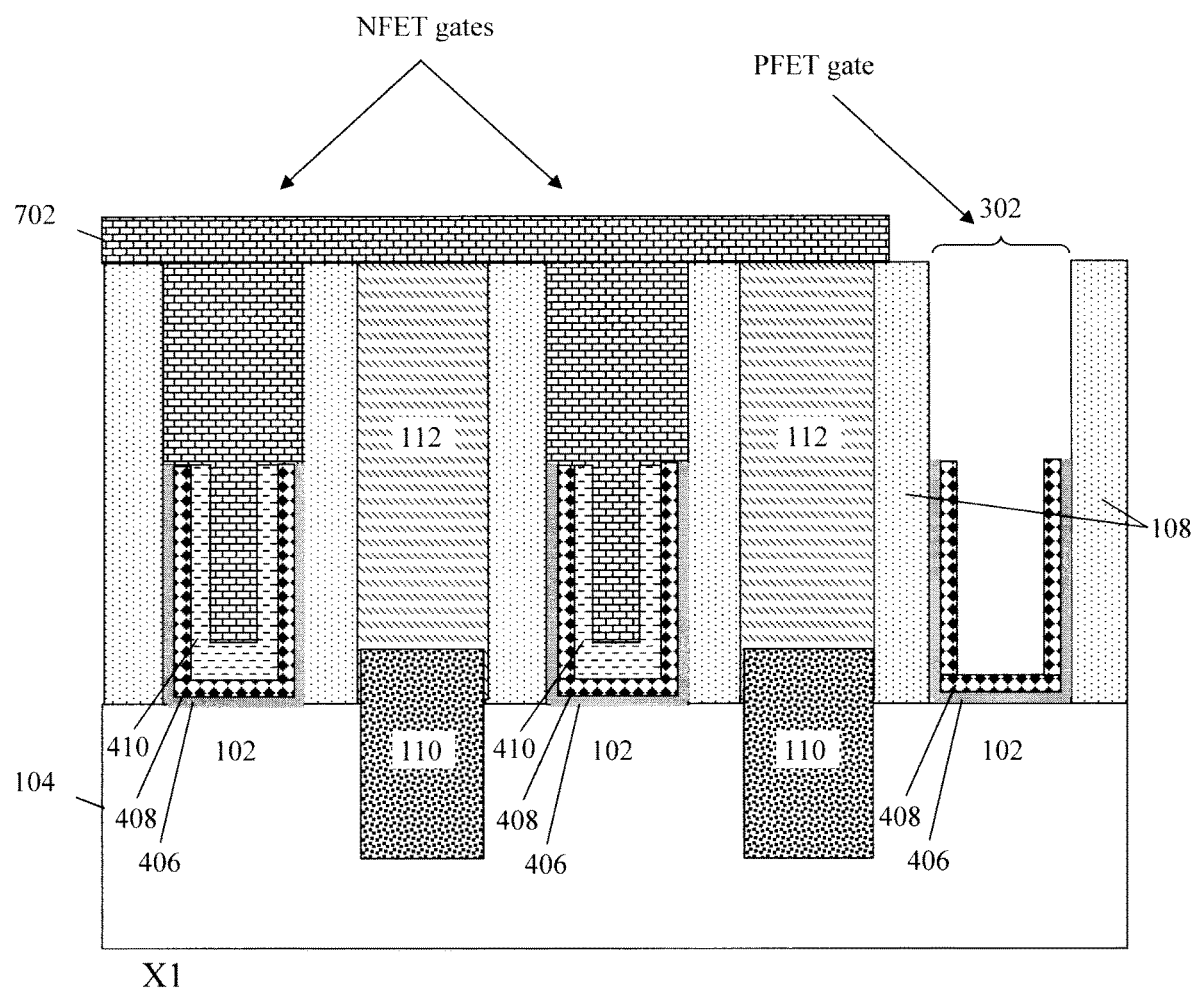
FIG. 7 is a cross-sectional diagram illustrating the remaining sacrificial material having been removed, a block mask having been formed over n-channel field effect transistor (NFET) gates, and the conformal gate stack having been removed from p-channel field effect transistor (PFET) gates according to an embodiment of the present invention.

Sacrificial material 412 is recessed to a level/which defines the upper and lower gate. Namely, as shown in FIG. 6 (a cross-sectional view X1), the gate stack (i.e., gate dielectric 408 and workfunction-setting metal 410) is then recessed to the level/set by the (recessed) sacrificial material 412. Doing so removes the gate stack (i.e., gate dielectric 408 and workfunction-setting metal 410) from the upper gate, i.e., the portion of the gate above 1. This is what is referred to herein as gate chamfering. According to an exemplary embodiment, the gate stack is recessed using a metal selective directional (anisotropic) etching process such as RIE.

Following recess of the gate stack, the remaining sacrificial material 412 is then selectively removed. See FIG. 7 (a cross-sectional view X1). According to an exemplary embodiment, sacrificial material 412 is removed using an etching process such as an $N_2/H_2$ ash. As provided above, in the instant example, the n-type workfunction-setting metal(s) is then selectively removed from the PFET gate (such that the interfacial oxide 406 and gate dielectric 408 remain in both the NFET and PFET gates) using a selective etching process.

To do so, a standard block mask 702 is formed over/masking the NFET gates. Suitable block mask materials include, but are not limited to, organic planarizing layer (OPL) materials. With block mask 702 in place over the NFET gates, a metal selective etching process such as a wet etching process can then be used remove the workfunction-setting metal 410 from the PFET gate stack. Removal of workfunction-setting metal 410 from the PFET gate opens up the gate trench 302 in the PFET gate. See FIG. 7. Following removal of workfunction-setting metal 410 from the PFET gate, the block mask 702 is then removed. By way of example only, the block mask 702 can be removed using a process such as ashing.

Figure 8:
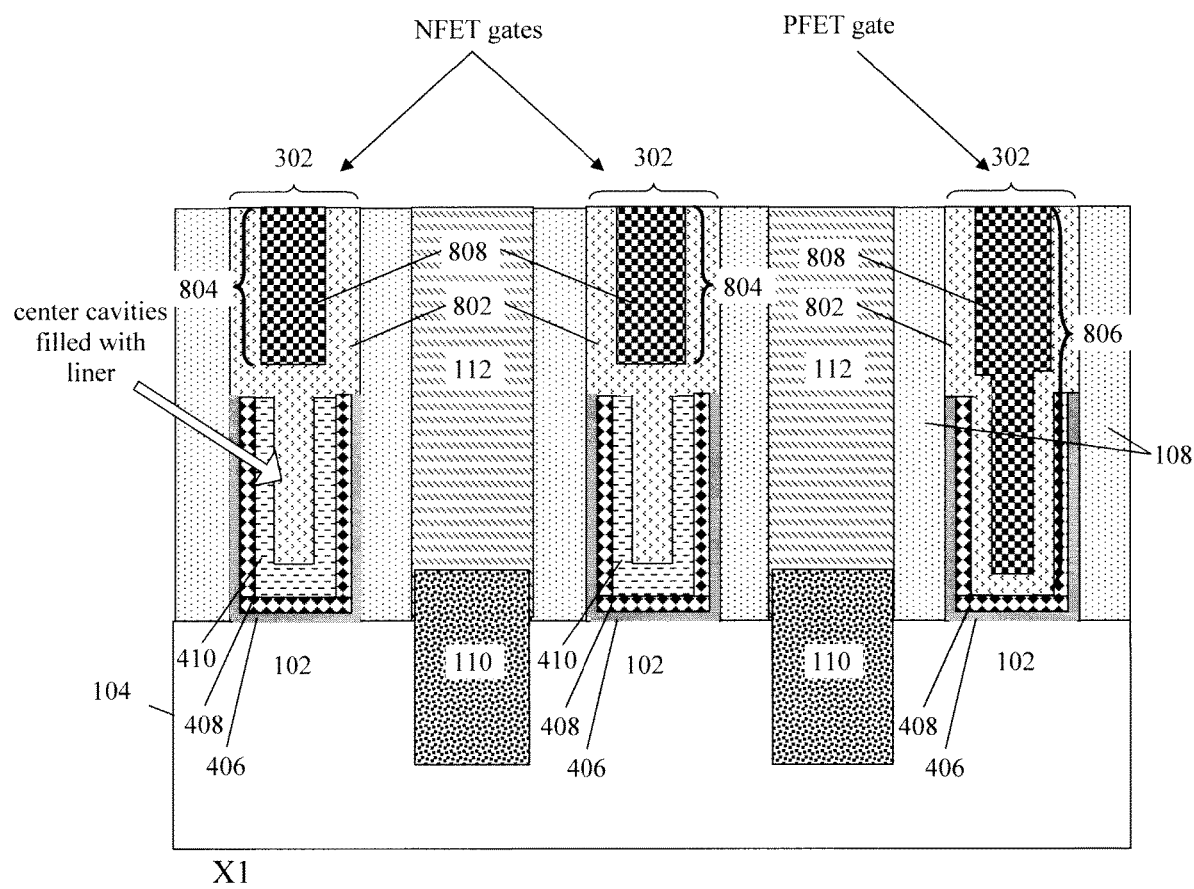
FIG. 8 is a cross-sectional diagram illustrating a conformal metal liner having been deposited into the gate trenches along the sidewalls of the first spacers and over the conformal gate stack in the NFET gates providing cavities in the upper NFET gates and upper/lower PFET gates, and the cavities having been filled with an inner core metal according to an embodiment of the present invention.

Removal of the block mask 702 opens up the cavities in the gate stacks at the center of each gate trench 302 in the NFET gates, which are then filled with a metal liner. Namely, as shown in FIG. 8 (a cross-sectional view X1), a conformal metal liner 802, which serves as the workfunction-setting metal for the PFET gate, is deposited into the gate trenches 302 and, in the case of the NFET devices, over the gate dielectric 408 and workfunction-setting metal 410 along the sidewalls of the spacers 108 in the upper portion of the NFET gate stacks. Suitable materials for the metal liner include, but are not limited to, titanium nitride (TiN) and/or tantalum nitride (TaN). Metal liner 802 can be deposited using a process such as such as CVD, ALD or PVD which will fill the cavities at the center of the (NFET) gate trenches 302. According to an exemplary embodiment, metal liner 802 has a thickness of from about 2 nm to about 10 nm and ranges therebetween. Metal liner 802 will serve as a p-type workfunction-setting metal in the PFET gate.

As shown in FIG. 8, conformally depositing the metal liner 802 in this manner will result in the formation of cavities 804 in the upper NFET gates and cavity 806 in the upper and lower PFET gate, which are then filled with an inner core metal 808. Suitable inner core metals 808 include, but are not limited to, low resistance metals such as tungsten (W), cobalt (Co) and/or ruthenium (Ru). The inner core metal 808 can be deposited using a process such as CVD or ALD. Following deposition, the metal overburden can be removed using a process such as CMP. The upper NFET and PFET gates now include inner core metal 808 in between the (outer) metal liner 802.

Figure 9:
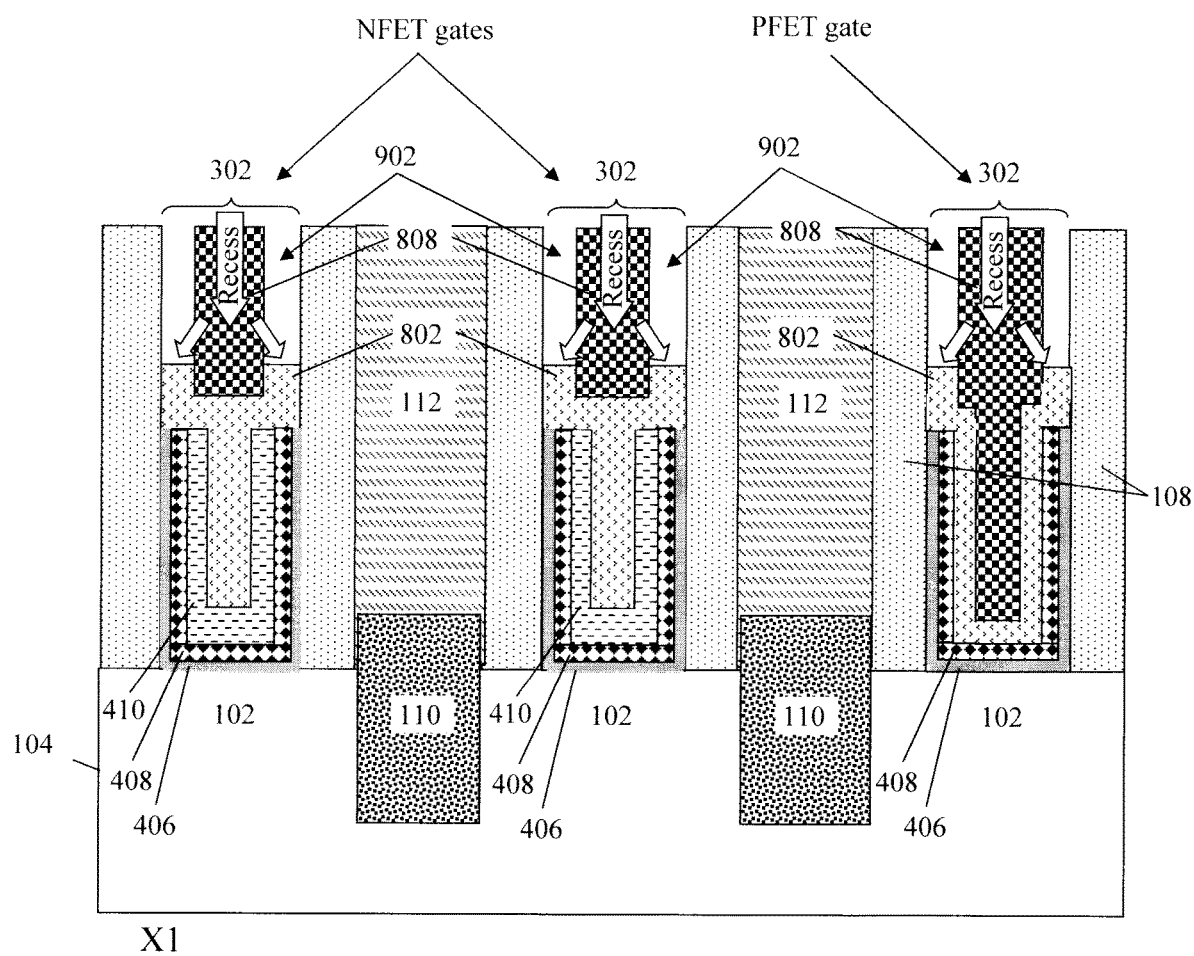
FIG. 9 is a cross-sectional diagram illustrating the metal liner having been selectively recessed to form divots in the upper NFET and PFET gates in between the first spacers and the inner core metal according to an embodiment of the present invention.
Figure 10:
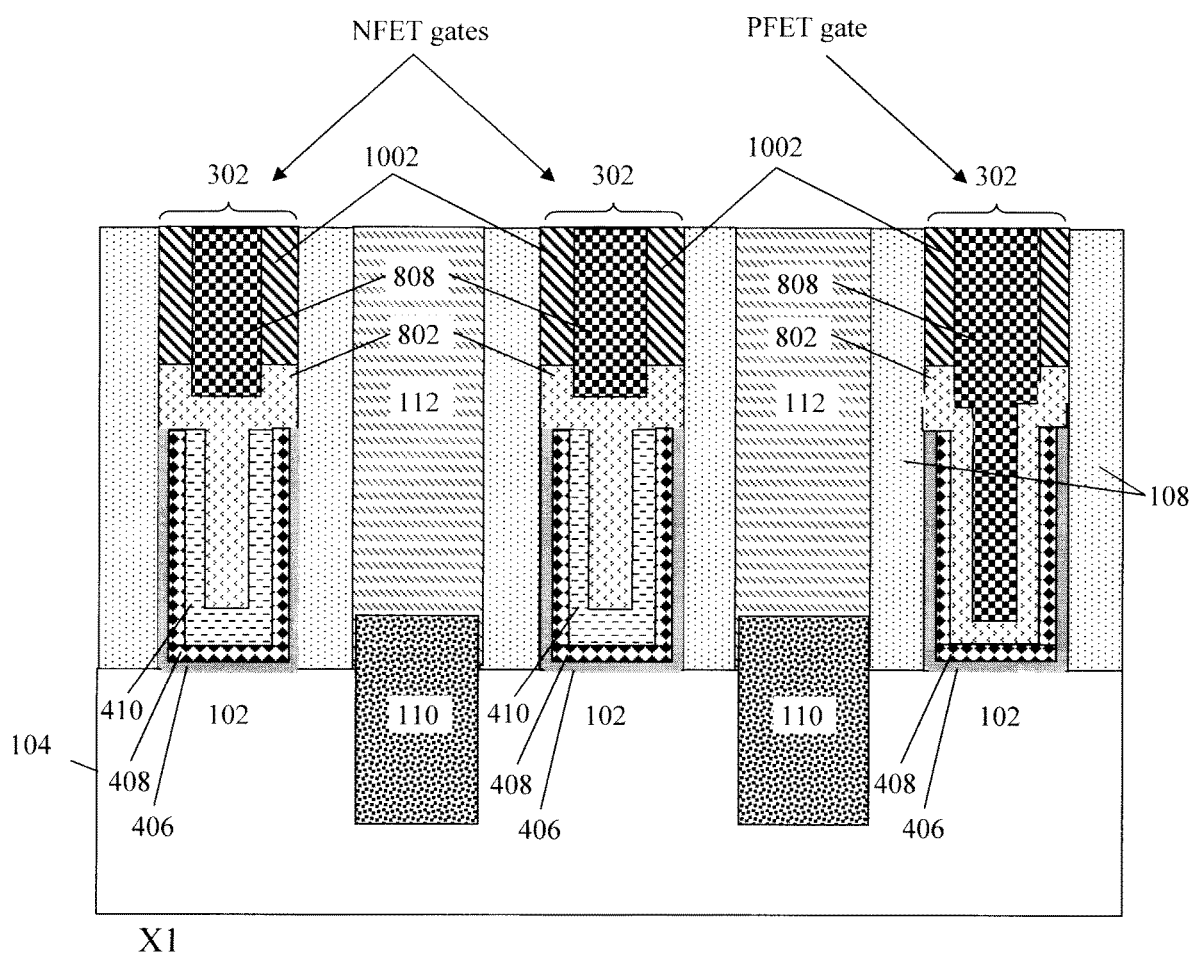
FIG. 10 is a cross-sectional diagram illustrating second spacers having been formed in the divots whereby the inner core metal in the upper NFET and PFET gates are now surrounded by the first and second spacers according to an embodiment of the present invention.
Figure 11:
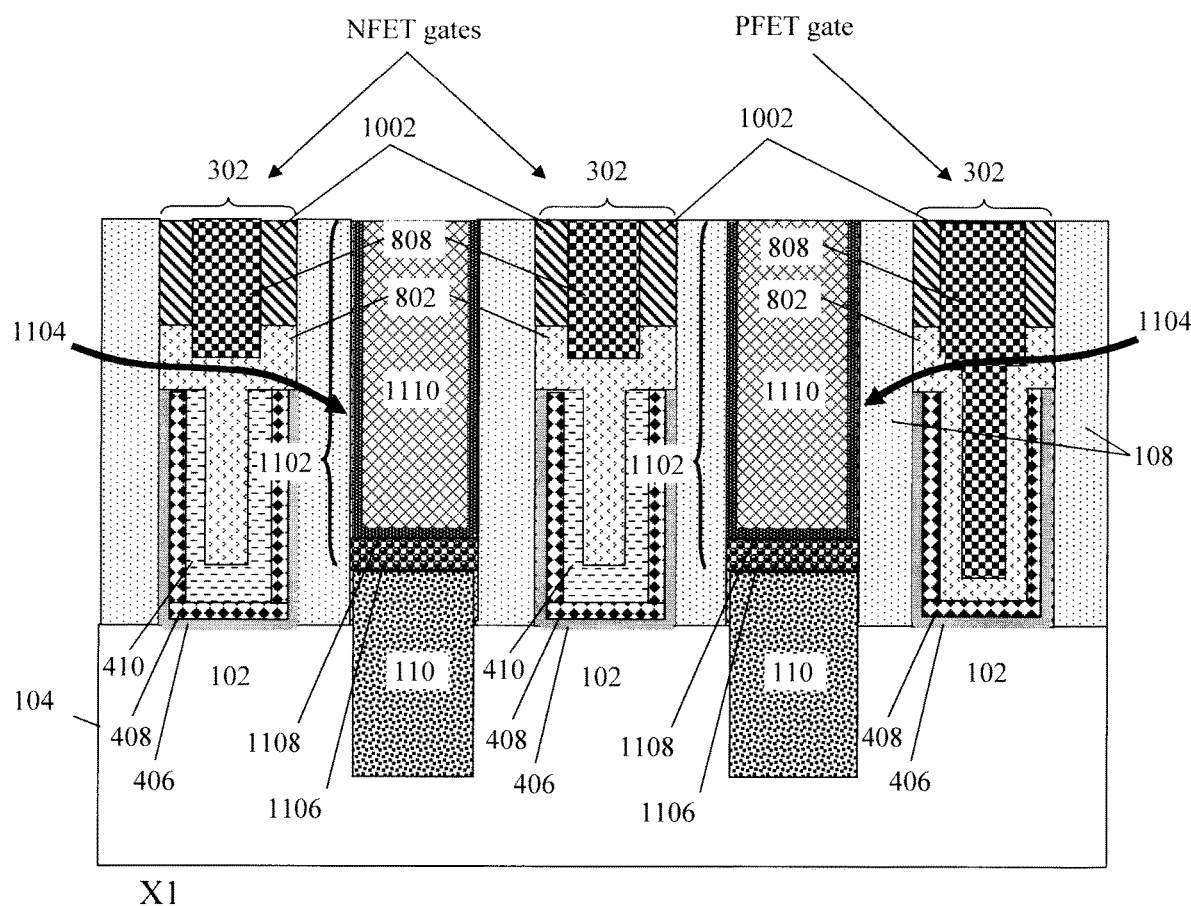
FIG. 11 is a cross-sectional diagram illustrating the ILD having been selectively removed forming trenches in between the first spacers over the source and drains, and the trenches having been filled with lower source and drain contacts according to an embodiment of the present invention.

As shown in FIG. 9 (a cross-sectional view X1), the (outer) metal liner 802 is next recessed in the upper NFET and PFET gates selective to the inner core metal 808 and gate spacers 108 (i.e., metal liner 802 is recessed below a top surface of inner core metal 808). By way of example only, the (outer) metal liner 802 can be selectively recessed by a plasma etching process using chlorine-containing plasma. As shown in FIG. 9, recessing the (outer) metal liner 802 results in the formation of divots 902 in the upper NFET and PFET gates alongside the inner core metal 808, i.e., divots 902 are present in the upper NFET and PFET gates in between the gate spacers 108 and the inner core metal 808. The terms 'first,' 'second' etc. may also be used herein when referring to the various cavities formed in accordance with the present process.

A spacer material is then deposited into and filling the divots 902 to form spacers 1002. See FIG. 10 (a cross-sectional view X1). Spacers 1002 may also be referred to herein as 'second spacers' where gate spacers 108 are the 'first spacers.' As provided above, the upper source and drain contact-to-gate short overlay margin is vastly improved by these first/second spacers 108/1002 that surround the upper NFET and PFET gates. Suitable spacer materials include, but are not limited to, oxide spacer materials such as SiOx and/or SiOC and/or nitride spacer materials such as SiN, SiBCN and/or SiOCN. The spacer material can be deposited using a process such as CVD, ALD or PVD. Following deposition, the spacer material can be planarized using a process such as CMP or etch back process.

Notably, by way of the present process flow the inner core metal 808 is not recessed (i.e., the top of inner core metal 808 is coplanar with the tops of spacers 108 and 1002). Having a non-recessed gate makes gate contact much easier than conventional gate contact over active area schemes. Further, as highlighted above, forming spacers 1002 over the recessed (outer) metal liner 802 vastly improves the upper source and drain contact-to-gate short overlay margin by surrounding the inner core metal 808 in the upper NFET and PFET gates with first/second spacers 108/1002.

The ILD 112 is then selectively removed forming trenches 1102 in between the spacers 108 over the source and drains 110, which are then filled with lower source and drain contacts 1104. See FIG. 11 (a cross-sectional view X1). As provided above, according to an exemplary embodiment, ILD 112 is formed from an oxide material such as SiOx and/or SiCOH and/or a ULK-ILD oxide material such as pSiCOH. In that case, it is preferable to employ a material for spacers 108 and 1002 that provides etch selectivity to those oxide materials like a nitride material such as SiN, SiBCN and/or SiOCN (see above). ILD 112 can then be removed via an oxide-selective etching process such as an oxide-selective RIE. Depending on the selectivity of the etching process, some erosion (not shown) might occur at the tops of the spacers 108 and 1002. However, this is inconsequential since a planarization step performed later on in the process will effectively remove this damage.

Figure 12:
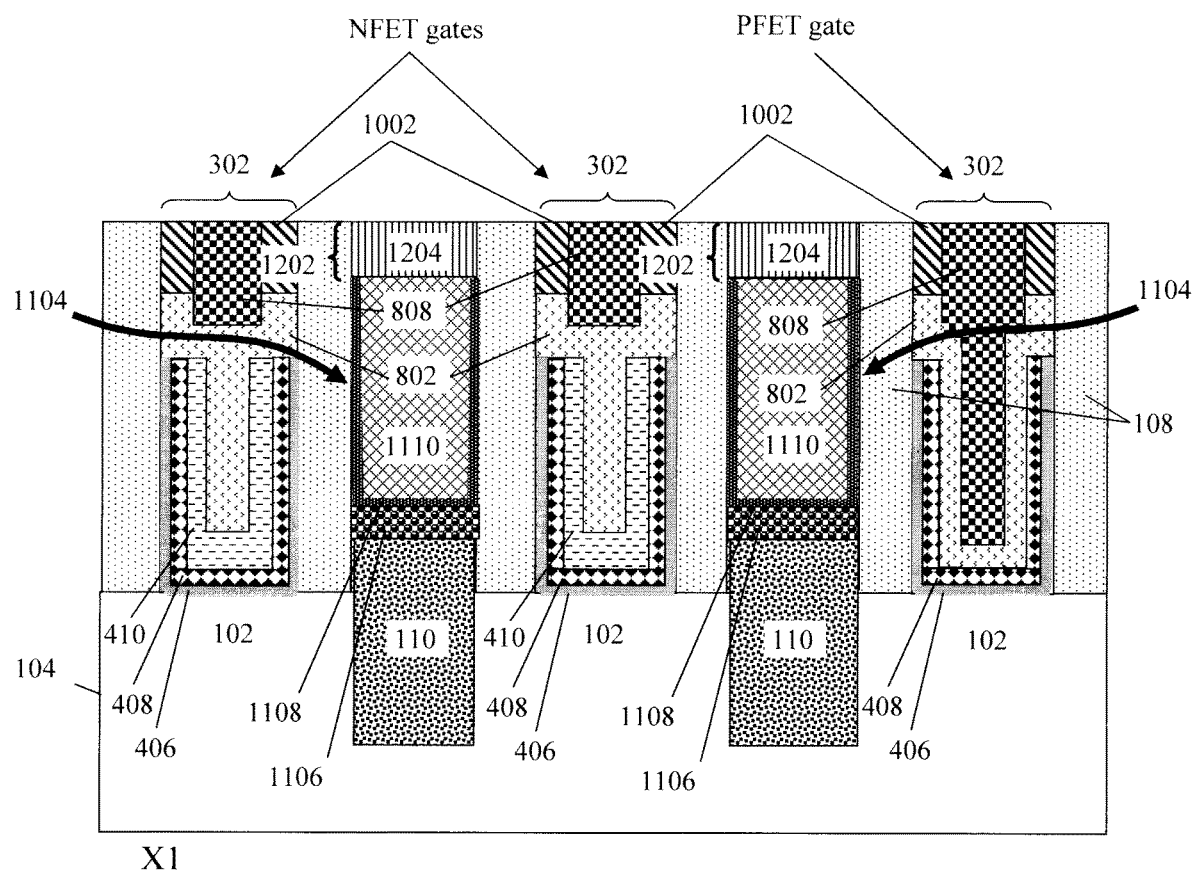
FIG. 12 is a cross-sectional diagram illustrating the lower source and drain contacts having been selectively recessed forming gaps over the lower source and drain contacts between adjacent first spacers, and source and drain caps having been formed in the gaps according to an embodiment of the present invention.

According to an exemplary embodiment, lower source and drain contacts 1104 are formed using a silicidation process followed by a liner deposition and metal fill. A silicide is a compound that includes Si (and/or Ge, SiGe, etc.) with another element such as a metal(s). For instance, a metal(s) (not shown) such as titanium (Ti) can be deposited into trenches 1102 on the bottom source and drains 110 using a process such as PVD, after which an anneal is performed to form a silicide 1106 with bottom source and drains 110. According to an exemplary embodiment, the anneal is performed at a temperature of from about 200° C. to about 800° C. and ranges therebetween. The silicide 1106 will form only where the metal(s) are in contact with the bottom source and drains 110. Thus, the silicide 1106 will grow up from the bottom source and drains 110. A silicide formed in a trench in this manner is also referred to herein as a trench silicide. Next, a conformal liner 1108 is deposited into and lining trenches 1102 over silicide 1106. Suitable materials for liner 1108 include, but are not limited to, titanium nitride (TiN). Liner 1108 can be deposited using a process such as CVD, ALD or PVD. According to an exemplary embodiment, liner 1108 has a thickness of from about 2 nm to about 5 nm and ranges therebetween. A fill metal 1110 is then deposited into trenches 1102 over the liner 1108/silicide 1106. Suitable fill metals 1110 include, but are not limited to, W, Co and/or Ru. Fill metal 1110 can be deposited using a process such as CVD or ALD. Following deposition, the metal overburden can be removed using a process such as CMP. Doing so advantageously removes any erosion that might have occurred at the tops of spacers 108 and 1002 from the ILD 112 RIE. Next, as shown in FIG. 12 (a cross-sectional view X1), the lower source and drain contacts 1104 are selectively recessed forming gaps 1202 over the lower source and drain contacts 1104 between adjacent spacers 108, which are then filled with a dielectric cap material to form source and drain caps 1204.

By way of example only, lower source and drain contacts 1104 can be selectively recessed by a plasma etching process using chlorine-containing plasma. Suitable dielectric cap materials include, but are not limited to, silicon carbide (SiC) and/or silicon dioxide (SiO$_2$). The dielectric cap material can be deposited into, and filling, the gaps 1202 using a process such as CVD, ALD or PVD. Following deposition, the dielectric cap material can be planarized using a process such as CMP.

Notably, source and drain caps 1204 formed in this manner are thinner than the dielectric caps employed in conventional processes. For instance, according to an exemplary embodiment, source and drain caps 1204 have a thickness of from about 5 nm to about 20 nm and ranges therebetween. Advantageously, a thinner source and drain cap 1204 facilitates formation of the upper source and drain contact (see below) and minimizes the risk of shorting that upper source and drain contact to the adjacent gate, e.g., by minimizing the amount of cap material that needs to be removed in order to access the lower source and drain contacts 110.

Figure 13:
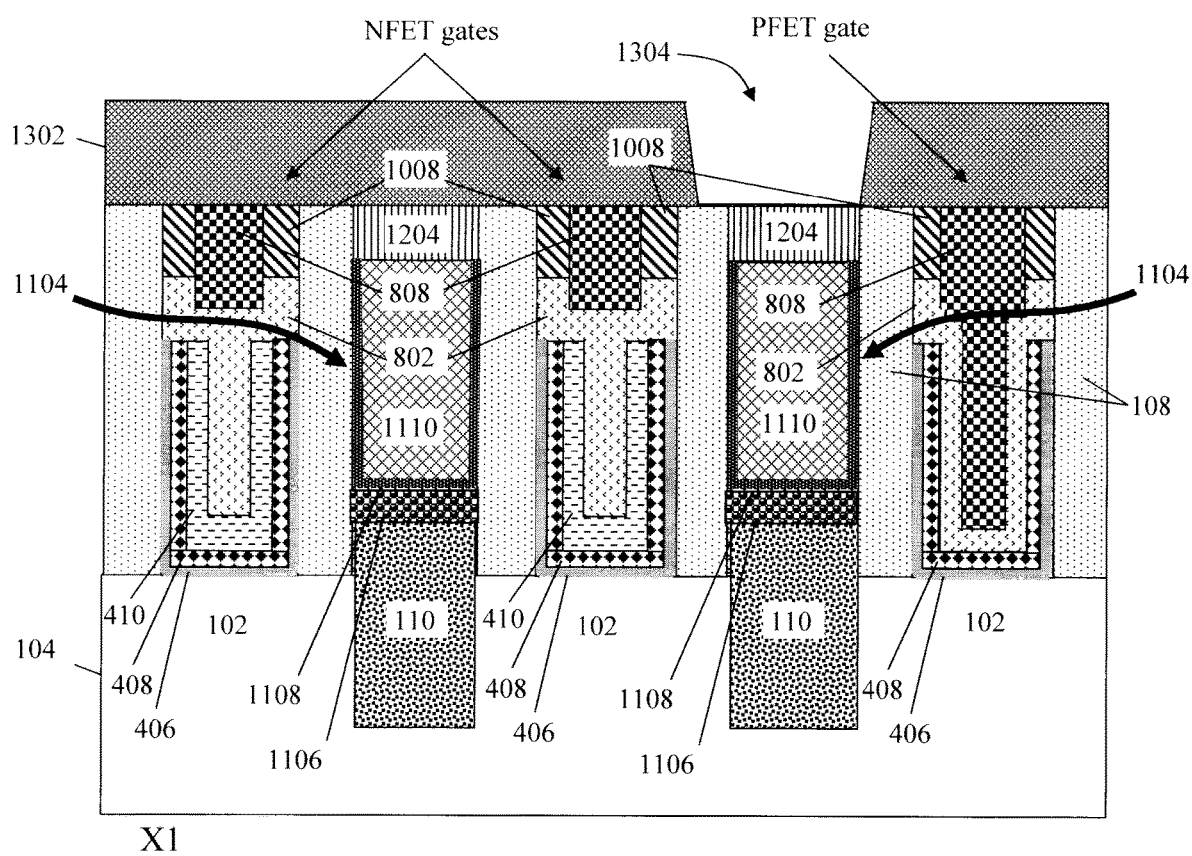
FIG. 13 is a cross-sectional diagram illustrating a middle-of-line (MOL) dielectric having been deposited over the NFET/PFET gates and source and drains, and a (first) contact via having been formed in the MOL dielectric over at least a select one of the lower source and drain contacts according to an embodiment of the present invention.

As shown in FIG. 13 (a cross-sectional view X1), an MOL dielectric 1302 is next deposited over the NFET/PFET gates and source and drains. Suitable MOL dielectrics 1302 include, but are not limited to, oxide materials such as SiOx and/or SiCOH and/or a ULK-ILD oxide material such as pSiCOH. MOL dielectric 1302 can be deposited using a process such as CVD, ALD or PVD. Following deposition, MOL dielectric 1302 can be planarized using a process such as CMP.

Standard lithography and etching techniques (see above) are then employed to pattern a (first) contact via 1304 in MOL dielectric 1302 over at least a select one of the lower source and drain contacts 1104. A directional (anisotropic) etching process such as RIE can be employed for the contact via etch. Preferably, there is etch selectivity between MOL dielectric 1302 and the source and drain caps 1204. For instance, MOL dielectric 1302 can be formed from an oxide material, whereas source and drain caps 1204 can be formed from a material such as SiC (see above). Thus, as shown in FIG. 13, the patterning of contact via 1304 in MOL dielectric 1302 exposes the source and drain cap 1204 over the select lower source and drain contact 1104.

Figure 14:
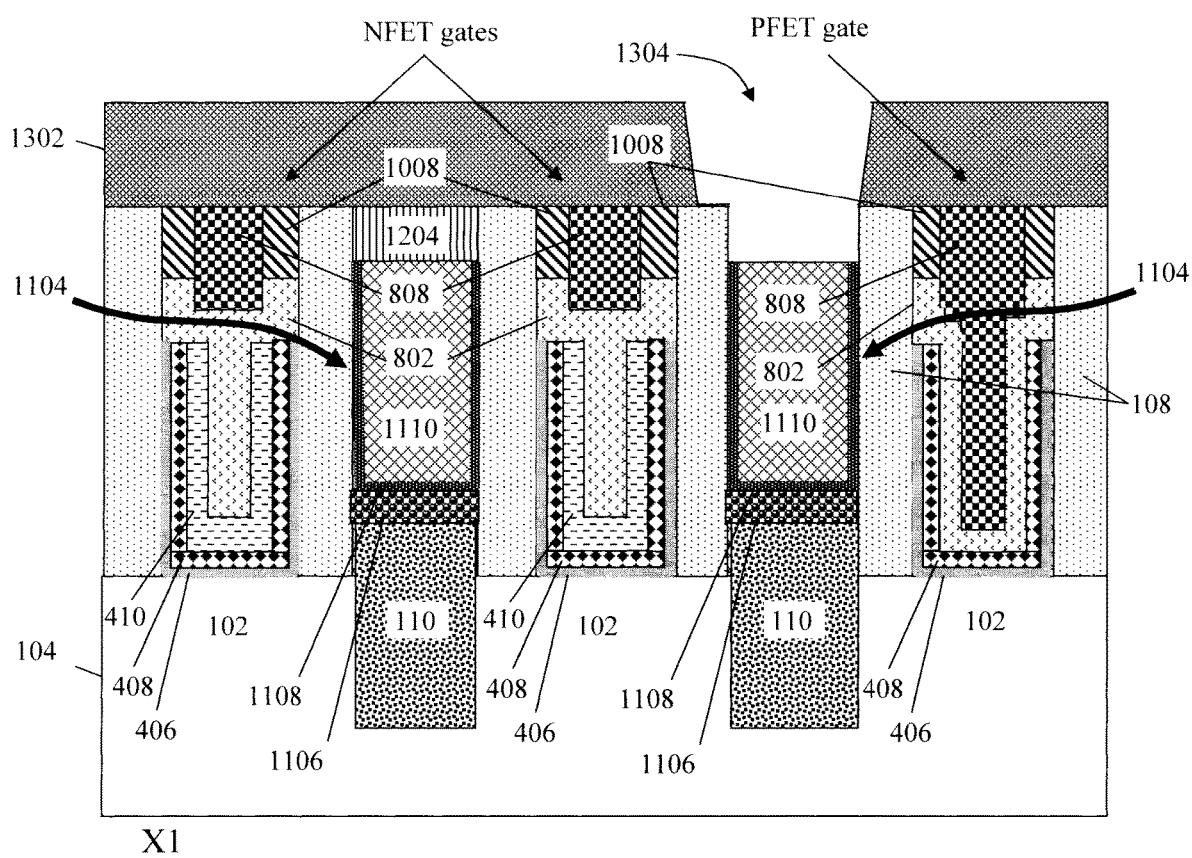
FIG. 14 is a cross-sectional diagram illustrating the source and drain cap over the select lower source and drain contact having been selectively removed through the first contact via, exposing the underlying lower source and drain contact according to an embodiment of the present invention.

As shown in FIG. 14 (a cross-sectional view X1), the source and drain cap 1204 over the select lower source and drain contacts 1104 is selectively removed through the contact via 1304, exposing the underlying lower source and drain contact 1104. For instance, by way of example only, a plasma etching process using fluorocarbon plasma can be used to selectively etch source and drain caps 1204.

Notably, since thin source and drain caps 1204 are used in the present process (e.g., source and drain caps 1204 have a thickness of from about 5 nm to about 20 nm and ranges therebetween—see above), the risk of shorting to the adjacent gate is minimized. Namely, only a small amount of cap material needs to be removed in order to access the underlying lower source and drain contacts 1104. Thus, the impact on the surrounding dielectric during removal of the source and drain cap 1204 is minimal. Further, as provided above, the presence of first/second spacers 108 and 1008 surrounding the upper NFET/PFET vastly improves the upper source and drain contact-to-gate short overlay margin.

Figure 15:
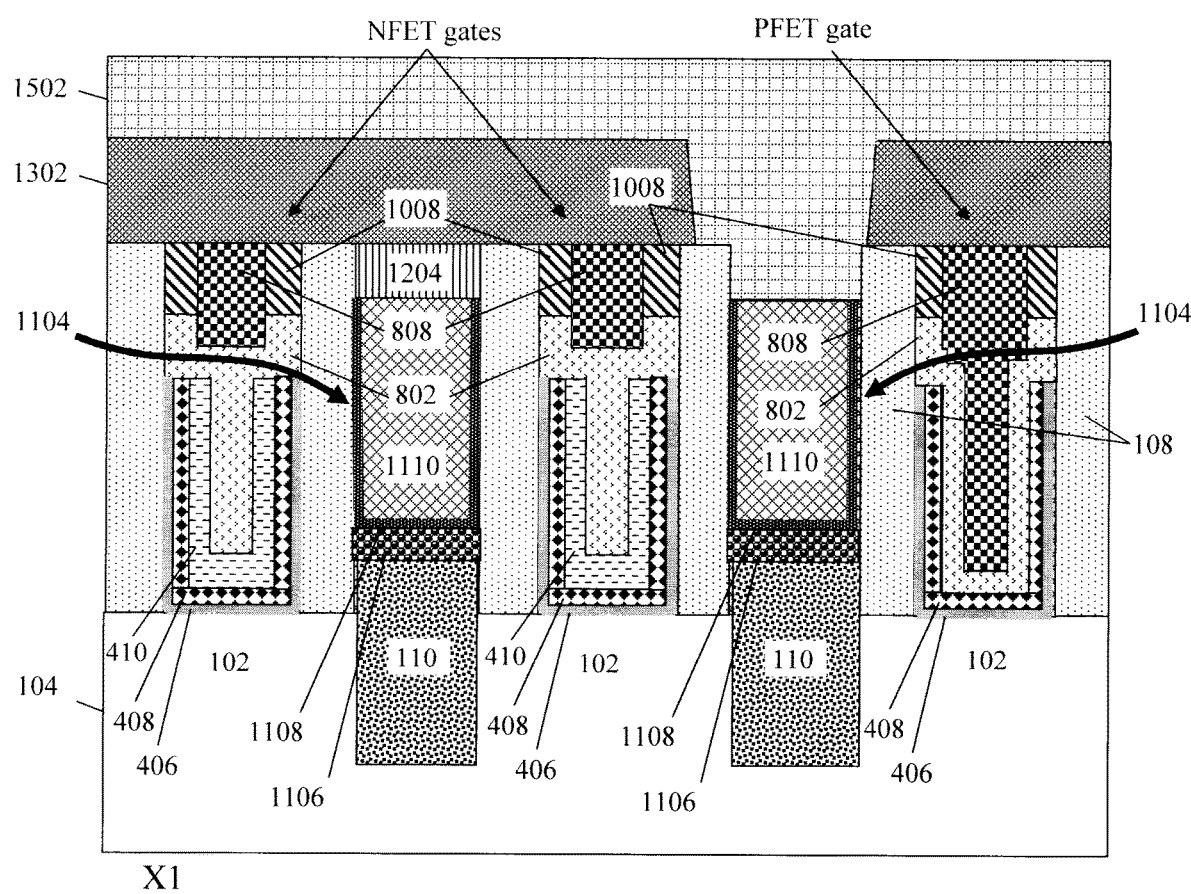
FIG. 15 is a cross-sectional diagram illustrating a standard block mask having been formed on the MOL dielectric filling the first contact via according to an embodiment of the present invention.
Figure 16:
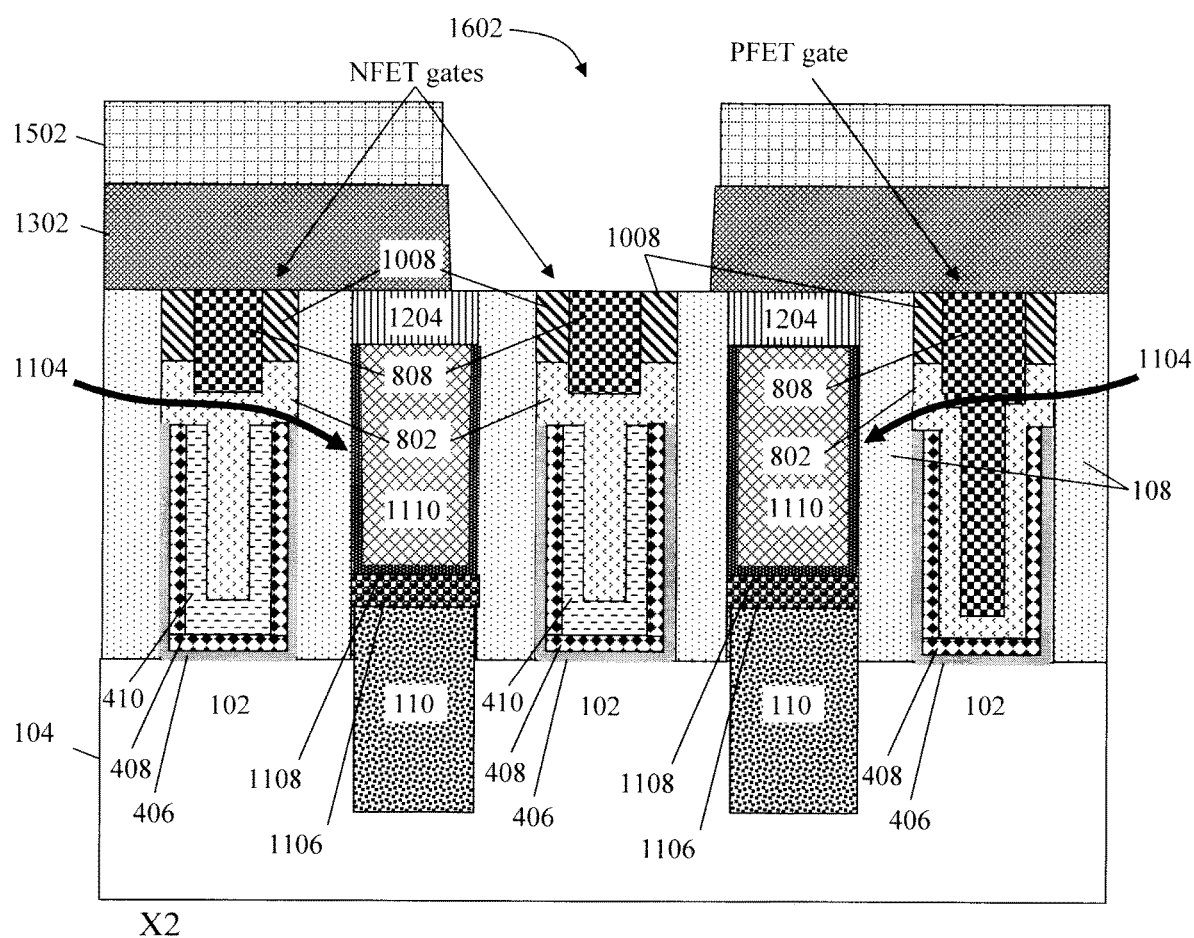
FIG. 16 is a cross-sectional diagram illustrating a (second) contact via having been formed in the MOL dielectric over a select one or more of the upper NFET and/or PFET gates according to an embodiment of the present invention.

As shown in FIG. 15 (a cross-sectional view X1), a standard block mask 1502 is formed on MOL dielectric 1302 filling contact via 1304. As provided above, suitable block mask materials include, but are not limited to, OPL materials. Block mask 1502 protects contact via 1304 during formation of a second contact via in MOL dielectric 1302 over a select one or more of the upper NFET and/or PFET gates. Namely, as shown in FIG. 16 (a cross-sectional view X2), standard lithography and etching techniques (see above) are next employed to pattern a (second) contact via 1602 in block mask 1502 and MOL dielectric 1302 over a select one or more of the upper NFET and/or PFET gates. For instance, in the present example, contact via 1602 is patterned in block mask 1502 MOL dielectric 1302 over a select one of the upper NFET gates. However, this configuration is merely an example provided to illustrate the present techniques. Notably, the lower source and drain contact 1104 in between the select upper NFET gate and the PFET gate is protected by its source and drain cap 1204 (i.e., preferably there is etch selectivity between MOL dielectric 1302 and the source and drain caps 1204—see above).

A directional (anisotropic) etching process such as RIE can be employed for the contact via etch. As shown in FIG. 16, the patterning of contact via 1602 in MOL dielectric 1302 exposes the inner core metal 808 over the select upper NFET gate. As provided above, the upper NFET/PFET gates are not recessed in the present process flow. As such, there is no need to remove any sort of cap from over the gates. Advantageously, not having to remove a gate cap means that there is less of a chance to short to the adjacent lower source and drain contact 1104. Block mask 1502 is then removed. Block mask 1502 can be removed using a process such as ashing.

Figure 17:
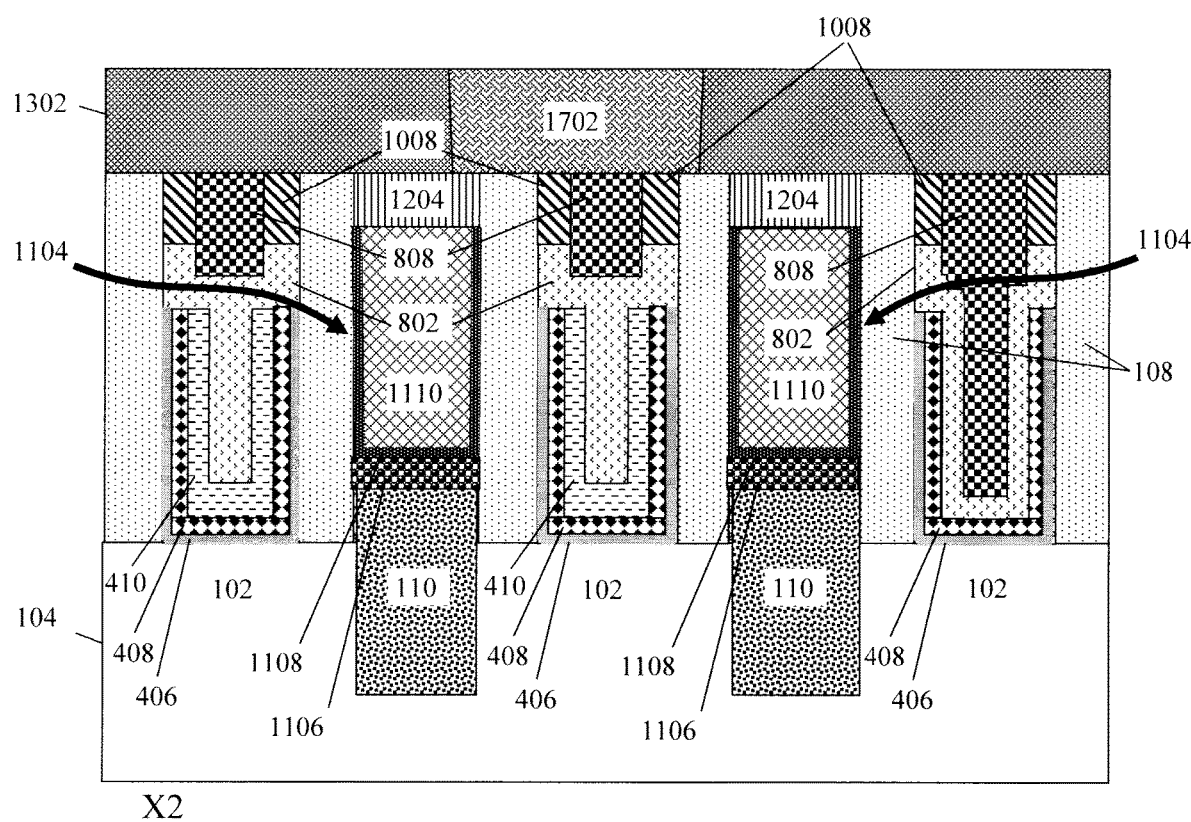
FIG. 17 is a cross-sectional diagram illustrating the second contact via having been filled with a contact metal(s) to form a gate contact according to an embodiment of the present invention.

The contact vias 1304 and 1602 are then filled with a contact metal(s) to form an upper source and drain contact and a gate contact, respectively. Namely, as shown in FIG. 17 (a cross-sectional view X2), contact via 1602 is filled with a contact metal(s) to form a gate contact 1702. As provided above, suitable contact metals include, but are not limited to, copper (Cu), cobalt (Co), ruthenium (Ru) and/or tungsten (W). The contact metal(s) can be deposited into the contact via 1602 using a process such as evaporation, sputtering or electrochemical plating. Prior to depositing the contact metal(s) into contact via 1602, a conformal barrier layer (not shown) can be deposited into and lining contact via 1602. Use of such a barrier layer helps to prevent diffusion of the contact metal(s) into the surrounding dielectric. Suitable barrier layer materials include, but are not limited to, tantalum (Ta), tantalum nitride (TaN), titanium (Ti), and/or titanium nitride (TiN). Additionally, a seed layer (not shown) can be deposited into and lining contact via 1602 prior to contact metal deposition. A seed layer facilitates plating of the contact metal into the contact via 1602. As shown in FIG. 17, the present process results in a unique gate structure that lands on the inner core metal 808 over a select one of the NFET/PFET gates and the first/second spacers 108/1008 in the upper portion of the select gate, and potentially a portion of the adjacent source and drain caps 1204.

Figure 18:
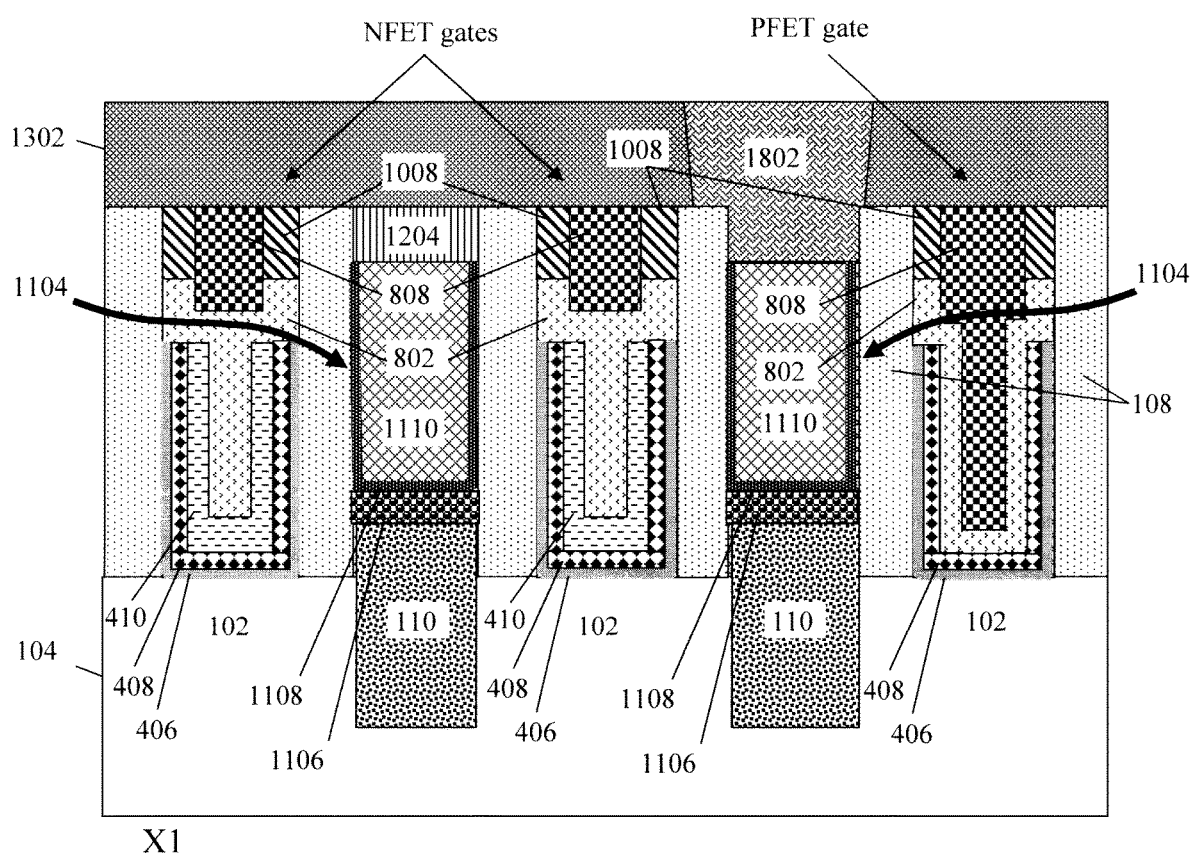
FIG. 18 is a cross-sectional diagram illustrating the first contact via having been filled with a contact metal(s) to form an upper source and drain contact according to an embodiment of the present invention.

As shown in FIG. 18 (a cross-sectional view X1), contact via 1304 is filled with a contact metal(s) to form an upper source and drain contact 1802. Suitable contact metals include, but are not limited to, Cu, Co, Ru and/or W. The contact metal(s) can be deposited into the contact via 1304 using a process such as evaporation, sputtering or electrochemical plating. Prior to depositing the contact metal(s) into contact via 1304, a conformal barrier layer (not shown) can be deposited into and lining contact via 1304. Use of such a barrier layer helps to prevent diffusion of the contact metal(s) into the surrounding dielectric. Suitable barrier layer materials include, but are not limited to, Ta, TaN, Ti, and/or TiN. Additionally, a seed layer (not shown) can be deposited into and lining contact via 1304 prior to contact metal deposition. A seed layer facilitates plating of the contact metal into the contact via 1304. Further, while depicted in separate figures, it is to be understood that one or more steps involved in the formation of gate contact 1702 and upper source and drain contact 1802 and can be performed concurrently and/or in an order different from what is depicted in the figures and as described above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:
fins patterned in a substrate;
source and drains formed in the fins;
at least one gate disposed over the fins, separated from the source and drains by first spacers, wherein a lower portion of the at least one gate comprises a workfunction-setting metal, and an upper portion of the at least one gate comprises an inner core metal between sidewall portions of an outer metal liner, and wherein the outer metal liner is recessed in between the first spacers and the inner core metal;
second spacers disposed over the recessed outer metal liner such that the first spacers and the second spacers surround the inner core metal in the upper portion of the at least one gate;
a middle-of-line (MOL) dielectric disposed over the at least one gate and the source and drains; and
a gate contact in the MOL dielectric over the at least one gate, wherein the gate contact lands on the inner core metal, and on the first spacers and the second spacers that surround the inner core metal of the at least one gate.

2. The semiconductor device of claim 1, further comprising:
lower source and drain contacts in between the first spacers over the source and drains;
source and drain caps disposed over the lower source and drain contacts; and
an upper source and drain contact in the MOL dielectric over a select one of the lower source and drain contacts.

3. The semiconductor device of claim 2, wherein the gate contact lands on the source and drain caps adjacent to the at least one gate.

4. The semiconductor device of claim 2, wherein the source and drain caps have a thickness of from about 5 nm to about 20 nm and ranges therebetween.

5. The semiconductor device of claim 2, wherein the source and drain caps comprise a material selected from a group consisting of: silicon carbide (SiC), silicon dioxide ($SiO_2$), and combinations thereof.

6. The semiconductor device of claim 1, wherein the at least one gate comprises at least one NFET gate and at least one PFET gate.

7. The semiconductor device of claim 1, wherein the outer metal liner comprises a material selected from a group consisting of: titanium nitride (TiN), tantalum nitride (TaN), and combinations thereof.

8. The semiconductor device of claim 1, wherein the outer metal liner has a thickness of from about 2 nm to about 10 nm and ranges therebetween.

9. The semiconductor device of claim 1, wherein the inner core metal comprises a metal selected from a group consisting of: tungsten (W), cobalt (Co), ruthenium (Ru), and combinations thereof.

10. The semiconductor device of claim 1, wherein the first spacers and the second spacers each comprises a material selected from a group consisting of: silicon oxide (SiOx), silicon oxycarbide (SiOC), silicon nitride (SiN), silicon borocarbonitride (SiBCN), silicon oxycarbonitride (SiOCN), and combinations thereof.

11. The semiconductor device of claim 1, wherein the lower portion of the at least one gate further comprises:
an interfacial oxide present on the fins;
a gate dielectric disposed over the interfacial oxide; and
the workfunction-setting metal disposed over the gate dielectric.

12. The semiconductor device of claim 11, wherein the gate dielectric comprises a high-κ gate dielectric selected from a group consisting of hafnium oxide ($HfO_2$), lanthanum oxide ($La_2O_3$), and combinations thereof.

13. The semiconductor device of claim 1, wherein the gate contact comprises a metal selected from a group consisting of copper (Cu), Co, Ru, W, and combinations thereof.

14. A semiconductor device, comprising:
fins patterned in a substrate;
source and drains formed in the fins;
at least one gate disposed over the fins, separated from the source and drains by first spacers, wherein a lower portion of the at least one gate comprises a workfunction-setting metal, and an upper portion of the at least one gate comprises an inner core metal between sidewall portions of an outer metal liner which is recessed in between the first spacers and the inner core metal, wherein the at least one gate comprises at least one NFET gate and at least one PFET gate, and the workfunction-setting metal is present only in the at least one NFET gate and comprises an n-type workfunction-setting metal, and wherein the outer metal liner serves as a p-type workfunction-setting metal in the at least one PFET gate;
second spacers disposed over the recessed outer metal liner such that the first spacers and the second spacers surround the inner core metal in the upper portion of the at least one gate;
a middle-of-line (MOL) dielectric disposed over the at least one gate and the source and drains; and
a gate contact in the MOL dielectric over the at least one gate, wherein the gate contact lands on the inner core metal, and on the first spacers and the second spacers that surround the inner core metal of the at least one gate.

15. The semiconductor device of claim 14, further comprising:
lower source and drain contacts in between the first spacers over the source and drains;
source and drain caps disposed over the lower source and drain contacts; and
an upper source and drain contact in the MOL dielectric over a select one of the lower source and drain contacts, wherein the gate contact lands on the source and drain caps adjacent to the at least one gate.

16. The semiconductor device of claim 15, wherein the source and drain caps have a thickness of from about 5 nm to about 20 nm and ranges therebetween.

17. The semiconductor device of claim 14, wherein the outer metal liner comprises a material selected from a group consisting of: titanium nitride (TiN), tantalum nitride (TaN), and combinations thereof.

18. The semiconductor device of claim 14, wherein the outer metal liner has a thickness of from about 2 nm to about 10 nm and ranges therebetween.

19. The semiconductor device of claim 14, wherein the inner core metal comprises a metal selected from a group consisting of: tungsten (W), cobalt (Co), ruthenium (Ru), and combinations thereof.

20. The semiconductor device of claim 14, wherein the first spacers and the second spacers each comprises a material selected from a group consisting of: silicon oxide (SiOx), silicon oxycarbide (SiOC), silicon nitride (SiN), silicon borocarbonitride (SiBCN), silicon oxycarbonitride (SiOCN), and combinations thereof.

* * * * *